US007238980B2

(12) United States Patent
Inoue et al.

(10) Patent No.: US 7,238,980 B2
(45) Date of Patent: Jul. 3, 2007

(54) SEMICONDUCTOR DEVICE HAVING PLURAL ELECTROCONDUCTIVE PLUGS

(75) Inventors: Tomoko Inoue, Kanagawa (JP); Ken Inoue, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 13 days.

(21) Appl. No.: 10/920,176

(22) Filed: Aug. 18, 2004

(65) Prior Publication Data

US 2005/0040449 A1    Feb. 24, 2005

(30) Foreign Application Priority Data

Aug. 22, 2003    (JP)    ............... 2003-298441

(51) Int. Cl.
*H01L 27/108*    (2006.01)
(52) U.S. Cl. ............... 257/306; 257/296; 257/758
(58) Field of Classification Search ............ 257/306, 257/758, 296
See application file for complete search history.

(56) References Cited

U.S. PATENT DOCUMENTS 5,204,286 A * 4/1993 Doan .................. 438/618
5,895,947 A * 4/1999 Lee et al. ............ 257/303

FOREIGN PATENT DOCUMENTS

JP    2001-257325    9/2001

* cited by examiner

*Primary Examiner*—Douglas W. Owens
(74) *Attorney, Agent, or Firm*—Young & Thompson (57) ABSTRACT

The short circuit between the bit line and thee cell contact can be prevented without considerably increasing the number of the manufacturing processes. The bit line 6 electrically coupled to the cell contact 9 is formed of the material, which is same as the material of cell contact 9. In the process for forming the bit line 6 on the cell contact interlayer film 8 by etching, the etching for creating an upper surface of the cell contact 9 that is not coupled to the bit line 6 being lower than an upper surface of the cell contact 9 that is coupled to the bit line 6. Further, after the formation of the bit line 6, the barrier metal layer 5 formed on the lower surface of the bit line 6 is selectively etched.

12 Claims, 11 Drawing Sheets

FIG. 1

TRANSISTORS FOR MEMORY CELL

PRIOR ART

FIG. 14

PRIOR ART

FIG. 15

PRIOR ART

FIG. 16

PRIOR ART

FIG. 17

PRIOR ART

FIG. 18

PRIOR ART

FIG. 19

PRIOR ART

FIG. 20

PRIOR ART

FIG. 21

PRIOR ART

FIG. 22

PRIOR ART

FIG. 23

PRIOR ART

SEMICONDUCTOR DEVICE HAVING PLURAL ELECTROCONDUCTIVE PLUGS

This application is based on Japanese patent application NO. 2003-298441, the content of which is incorporated hereinto by reference.

BACKGROUND OF THE INVENTION

1. Field of the Invention

The present invention relates to a semiconductor device and a method for manufacturing thereof.

2. Description of the Related Art

A memory cell composing DRAM generally consists of a transistor for memory cell and a capacitive element. Capacitor over bit line (COB) DRAM having a structure, in which a capacitive element of DRAM is disposed over a bit line, is proposed for achieving higher degree of integration of the memory cell. Typical conventional structure of such COB DRAM is shown in FIG. 13.

In this type of the conventional DRAM, a MOS transistor formed on a semiconductor substrate such as a silicon substrate 10 or the like functions as a transistor for memory cell. A bit line 6 is formed on an upper layer of the transistor for a memory cell through a cell-contact interlayer film 8, and a capacitive element 11 is formed on an upper layer of the bit line 6 through a capacitive-contact interlayer film 7. The bit line 6 is coupled to a transistor for memory cell formed on the silicon substrate 10 by being coupled to a cell contact 9 through a barrier metal layer 5, and the capacitive element 11 is coupled to the transistor for memory cell formed on the silicon substrate 10 through the capacitive contact 4 and the cell contact 9.

Figure 13:
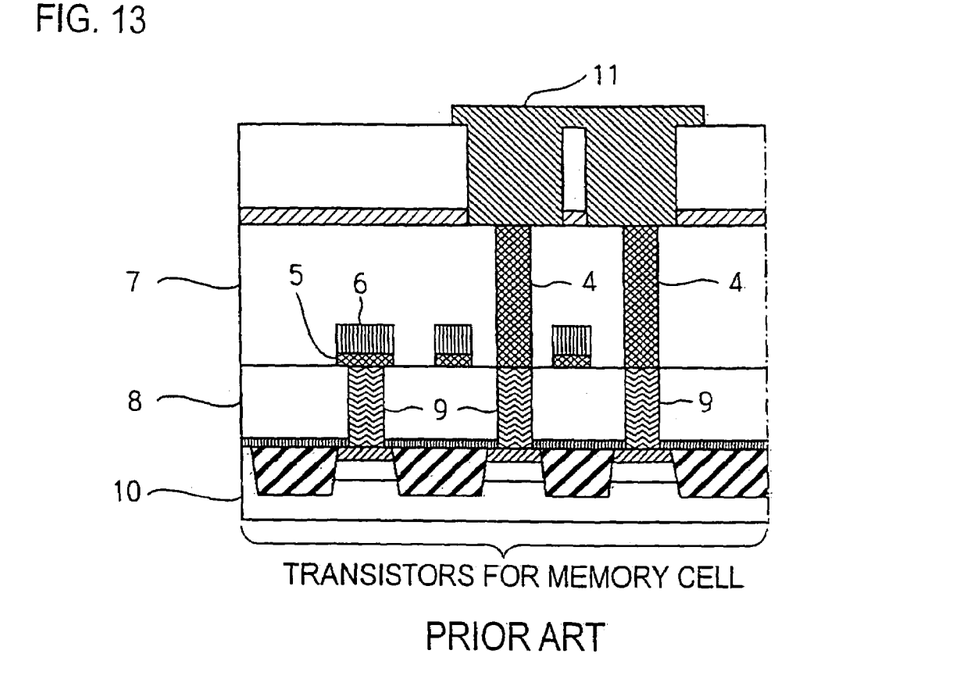
FIG. 13 is a cross sectional view of a conventional semiconductor device.

Although FIG. 13 illustrates the barrier metal layer 5 provided as an underlying layer disposed under the bit line 6, it is intended to additionally include the barrier metal layer 5 when the term "bit line 6" appears in the following description.

In such structure, it is designed to include a configuration of maintaining a predetermined spacing between the bit line 6 and the capacitive contact 4 or the cell contact 9, in order to inhibit a generation of electric short circuit. However, since the progresses in increasing the level of the integration in the semiconductor devices necessarily reduce the room for the spacing between the bit line 6 and the capacitive contact 4 or the cell contact 9, a short circuit may be occurred between the bit line 6 and the capacitive contact 4 or the cell contact 9 by a misalignment caused in the formation of the bit line 6 or a misalignment caused in the formation of the capacitive contact 4 or the like. When the short circuit is occurred between the bit line 6 and the capacitive contact 4 or the cell contact 9 as described above, failure easily occurs in the resultant memory cell, thereby occasionally reducing the yield of DRAM.

Figure 14:
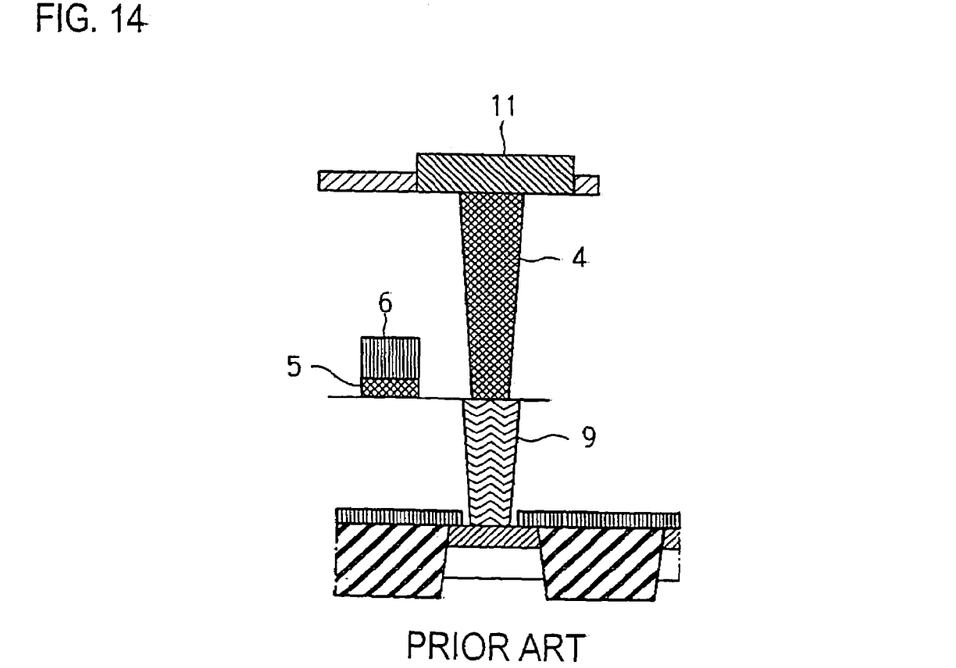
FIG. 14 is a partially-enlarged cross sectional view of the conventional semiconductor device, showing the relationship of the capacitive contact 4, the cell contact 9 and the bit line 6.

Further, FIG. 13 also illustrates that diameters of the capacitive contact 4 and the cell contact 9 are constant at both the upper and the lower ends. However, as shown in FIG. 14, the reality is that the diameters of the capacitive contact 4 and the cell contact 9 at the upper ends thereof is larger than those at the lower ends, thereby forming the inverse tapered shapes. Therefore, the room for the spacing for preventing the short circuit between the bit line 6 and the cell contact 9 becomes smaller than the room for the spacing for preventing the short circuit between the bit line 6 and the capacitive contact 4.

Figure 15:
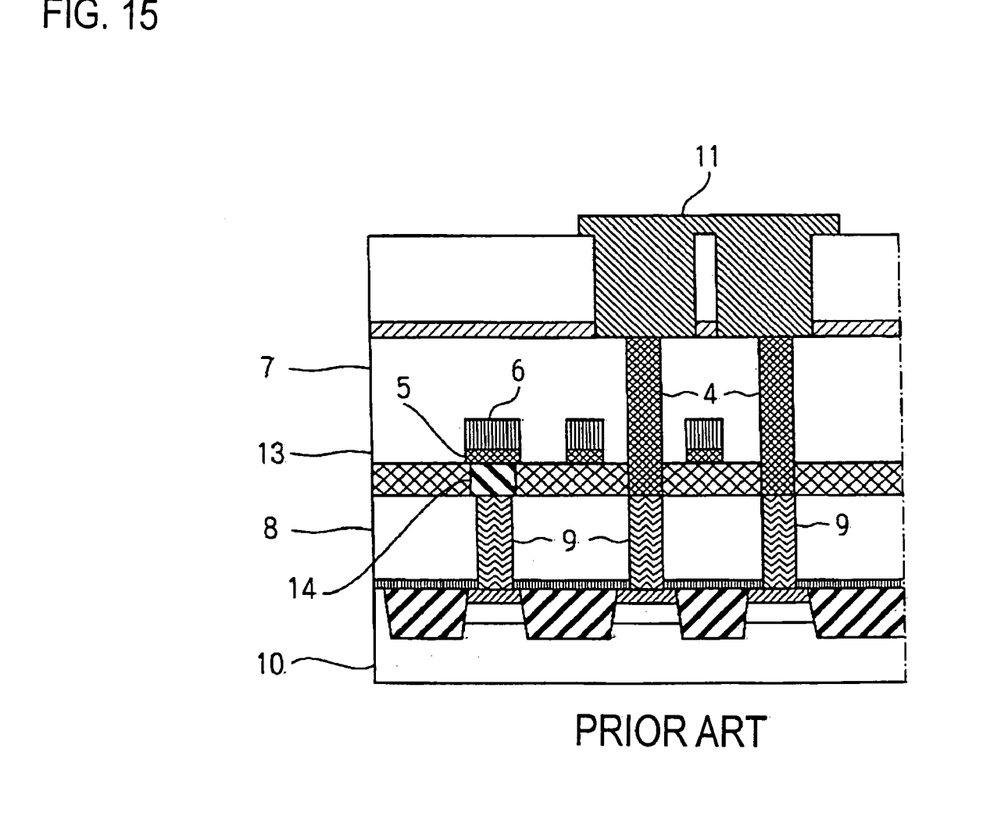
FIG. 15 is a cross sectional view of the conventional semiconductor device, further comprising a bit contact interlayer film 13 formed on the cell contact interlayer film 8.

Thus, a semiconductor device additionally including a bit contact interlayer film 13 formed on the cell contact interlayer film 8 is proposed, for the purpose of inhibiting the short circuit between the bit line 6 and the cell contact 9. The constitution of such conventional semiconductor device is shown in FIG. 15. In this type of conventional semiconductor device, a bit contact interlayer film 13 is formed after forming the cell contact interlayer film 8, and a bit contact 14 is formed on a portion of the bit contact interlayer film 13 that provides coupling of the cell contact 9 to the bit line 6. Having such structure, larger room for the spacing for preventing the short circuit between the upper end of the cell contact 9 and the bit line 6 can be acquired by extending the distance therebetween.

Next, a method for manufacturing a semiconductor device having a structure, in which a bit contact interlayer film 13 is formed to extend the room for the spacing for preventing the short circuit at the upper ends of the bit line 6 and the cell contact 9, will be described as follows with reference to FIG. 16 to FIG. 23.

Figure 16:
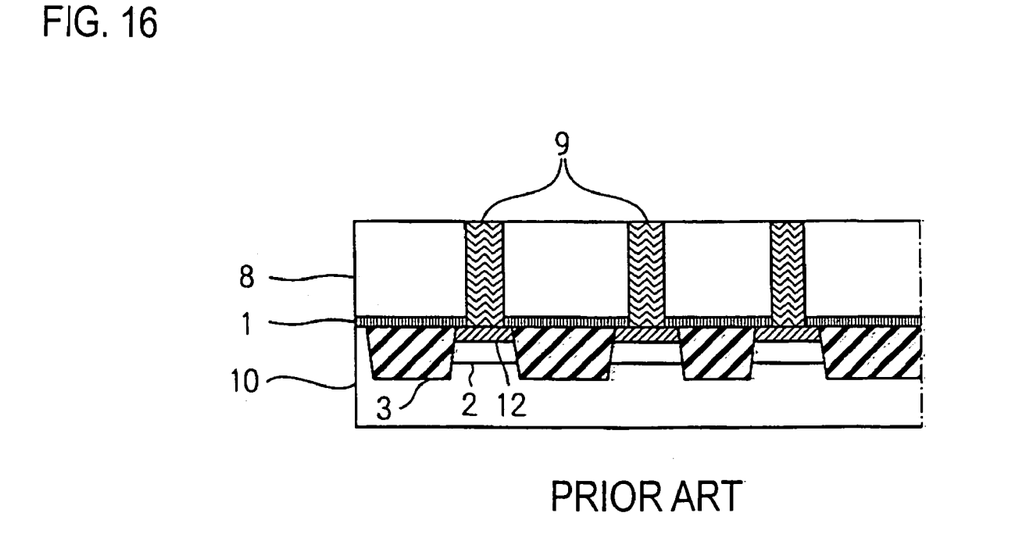
FIG. 16 is a cross sectional view of the conventional semiconductor device, illustrating a conventional method for manufacturing the semiconductor device comprising the bit contact interlayer film 13 formed thereon.

First of all, as shown in FIG. 16, shallow grooves are formed on a silicon substrate 10, similarly as in the typical manufacturing process for DRAM, and the grooves are filled with an insulating material to form element isolation insulating films 3, so that the memory cell area is sectioned into individual cell areas. Then, an impurity is implanted into the silicon substrate 10 to form source drain regions 2, thereby forming MOS transistors, which will be transistors for the memory cells.

Next, cobalt silicide layers 12 are formed by silicidating the entire surfaces of the diffusion layers and the gates of respective transistors with cobalt. Thereafter, silicon nitride films 1 are formed on the surface of the silicon substrate 10 containing the surfaces of element isolation insulating films 3 to coat the respective transistors.

Next, cell contact interlayer films 8 are formed by using a material such as silicon oxide or the like so as to cover the respective transistors for memory cells in the memory cell area. Then, contact holes for coupling the bit line and the capacitive element to transistors for memory cells in the cell contact interlayer films 8 are formed via a selective etch process. Then, tungsten (W) is deposited on the entire surfaces thereof via a chemical vapor deposition (CVD) until the contact holes are filled therewith, after depositing the barrier metal layer of titanium nitride (TiN) in the contact hole. Thereafter, the surfaces of the cell contact interlayer films 8 are planarized via a chemical mechanical polishing (CMP) so as to leave W only in respective contact holes, thereby forming cell contacts 9. A cross sectional view of the semiconductor device after the steps so far are finished is shown in FIG. 16.

Figure 17:
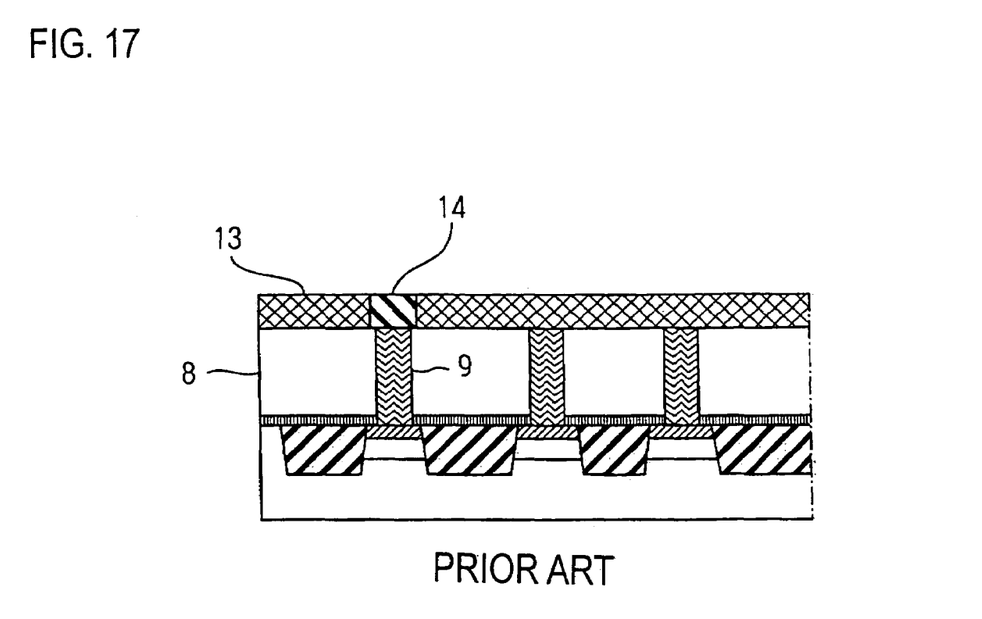
FIG. 17 is a cross sectional view of the conventional semiconductor device, illustrating the conventional method for manufacturing the semiconductor device comprising the bit contact interlayer film 13 formed thereon.

Next, as shown in FIG. 17, a bit contact interlayer film 13 comprising silicon oxide is formed to a predetermined thickness on the surfaces of the cell contact interlayer films 8 that include exposed surfaces of the cell contact 9 to coat the surfaces of the cell contacts 9 therewith. Then, the bit contact interlayer film 13 is etched so that only the positions directly above the portions electrically coupled to the bit lines 6 are selectively etched among the cell contacts 9 to form contact holes, thereby exposing the upper surface of the cell contacts 9. Then, W is deposited via CVD until the formed contact holes are filled therewith after depositing the barrier metal layer of titanium nitride (TiN) in the contact hole, similarly as in the formation process of the cell contacts 9, and the surfaces thereof are planarized via CMP so as to leave W only in respective contact holes, thereby forming bit contacts 14 for coupling to the bit lines 6. A cross sectional view of the semiconductor device after the steps so far are finished is shown in FIG. 17.

Figure 18:
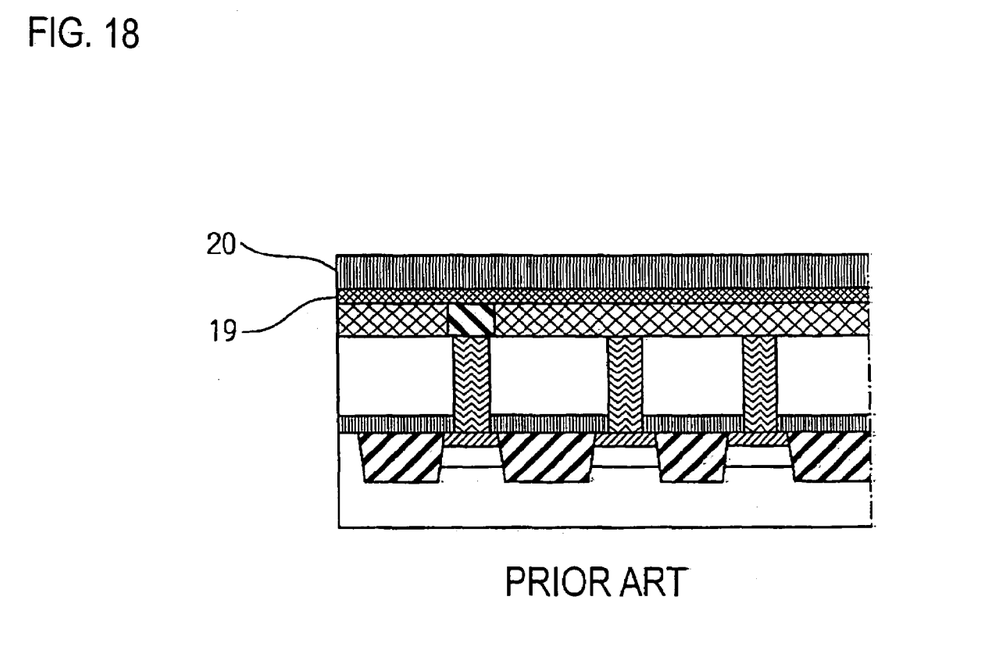
FIG. 18 is a cross sectional view of the conventional semiconductor device, illustrating the conventional method for manufacturing the semiconductor device comprising the bit contact interlayer film 13 formed thereon.

Next, as shown in FIG. 18, titanium nitride (TiN) film 19 for forming barrier metal layers 5 and tungsten (W) film 20 for forming bit lines 6 are deposited on the surfaces of the bit contact interlayer film 13.

Figure 19:
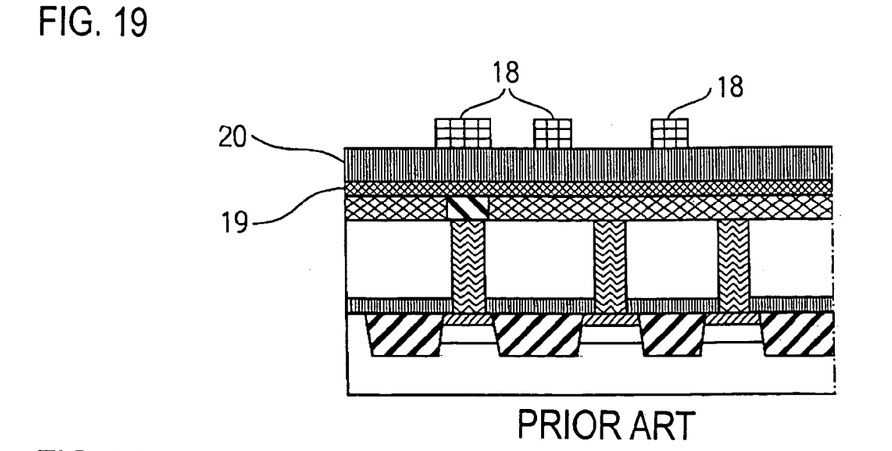
FIG. 19 is a cross sectional view of the conventional semiconductor device, illustrating the conventional method for manufacturing the semiconductor device comprising the bit contact interlayer film 13 formed thereon.
Figure 20:
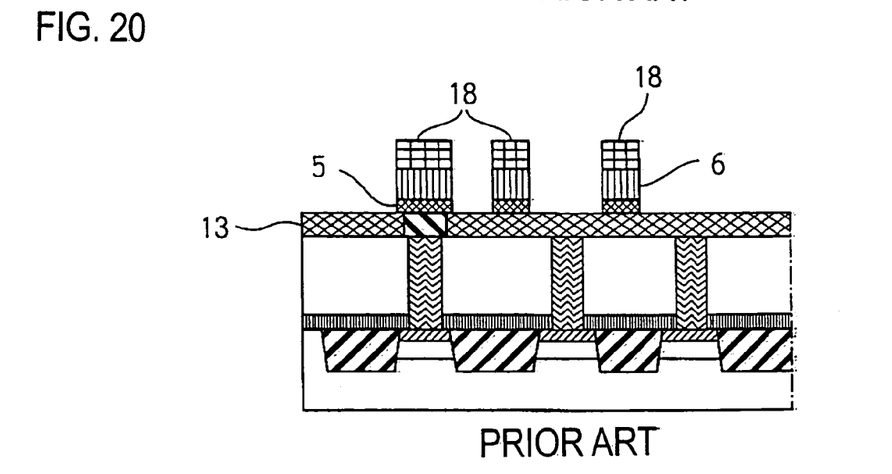
FIG. 20 is a cross sectional view of the conventional semiconductor device, illustrating the conventional method for manufacturing the semiconductor device comprising the bit contact interlayer film 13 formed thereon.
Figure 21:
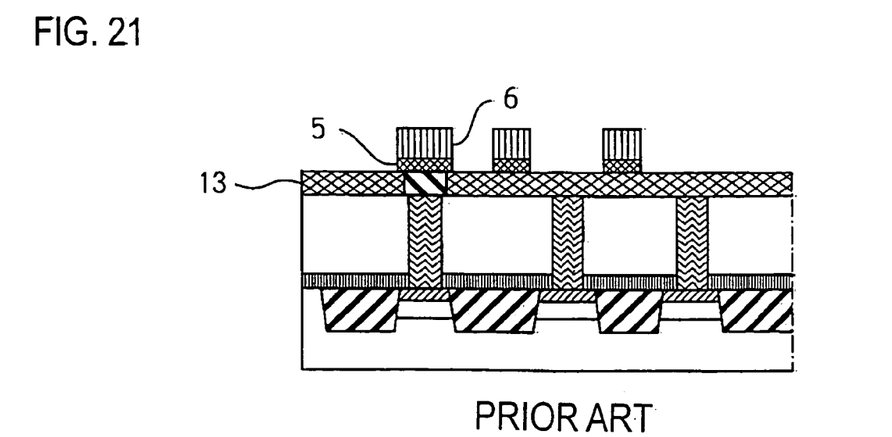
FIG. 21 is a cross sectional view of the conventional semiconductor device, illustrating the conventional method for manufacturing the semiconductor device comprising the bit contact interlayer film 13 formed thereon.

Then, as shown in FIG. 19, photo resists 18 are formed on the portions on the tungsten film 20, on which bit lines are formed. Then, as shown in FIG. 20, these layers are patterned to form bit lines 6 and barrier metal layers 5 having predetermined geometries through the mask of the photo resist 18. The photo resists 18 are then stripped after the bit lines 6 and the barrier metal layers 5 are formed. A cross sectional view of the semiconductor device after the steps so far are finished is shown in FIG. 21.

Figure 22:
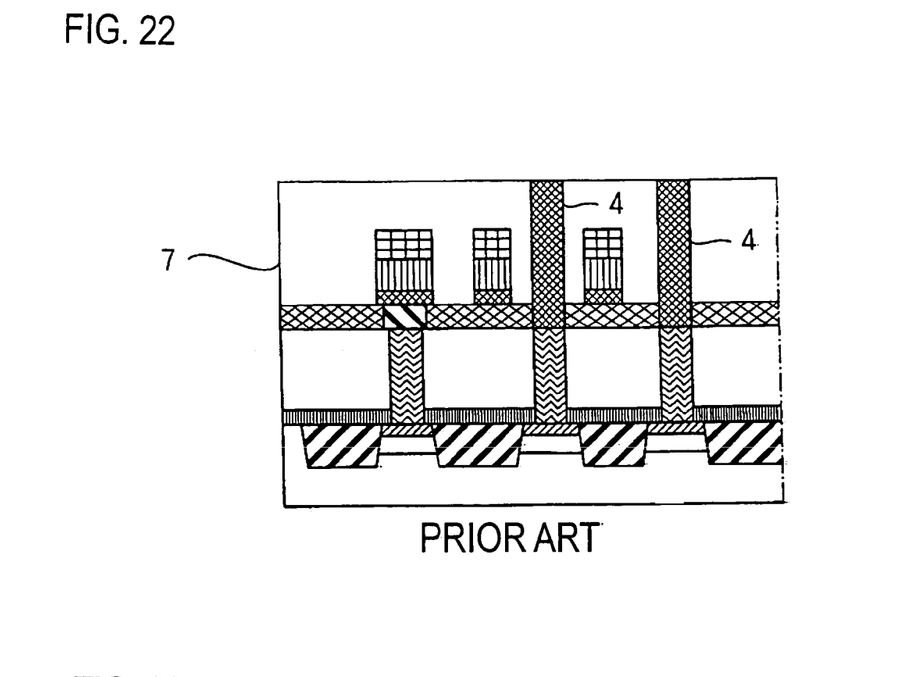
FIG. 22 is a cross sectional view of the conventional semiconductor device, illustrating the conventional method for manufacturing the semiconductor device comprising the bit contact interlayer film 13 formed thereon.

Then, similarly as in the formation process for the cell contacts 9 or the bit contacts 14, W is deposited via CVD until the contact holes are filled therewith after depositing the barrier metal layer of titanium nitride (TiN) in the contact hole, and the surfaces thereof are planarized via CMP so as to leave W only in respective contact holes, thereby forming capacitive contacts 4 for coupling to the capacitive elements 11. A cross sectional view of the semiconductor device after the steps so far are finished is shown in FIG. 22.

Figure 23:
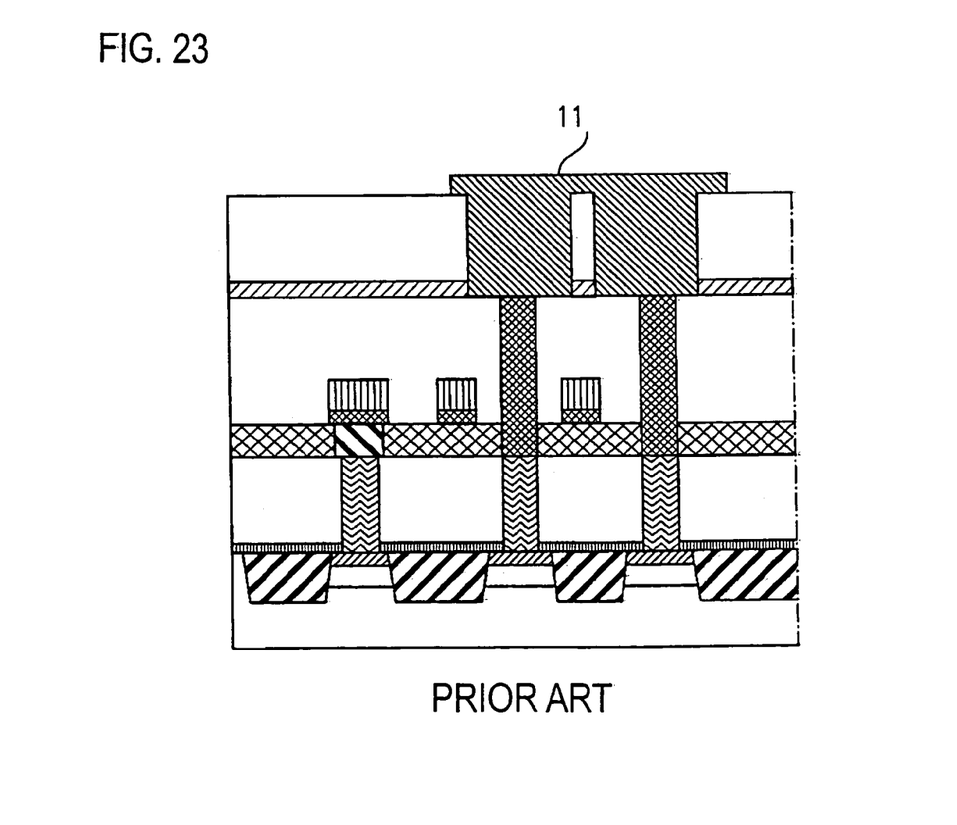
FIG. 23 is a cross sectional view of the conventional semiconductor device, illustrating the conventional method for manufacturing the semiconductor device comprising the bit contact interlayer film 13 formed thereon.

Then, a capacitive element 11 for coupling to the capacitive contact 4 is finally formed to complete the semiconductor device. A cross sectional view of the semiconductor device after the steps so far are finished is shown in FIG. 23.

In such conventional semiconductor device, a bit contact interlayer film 13 is provided to keep the bit line 6 and the cell contact 9 apart from each other, thereby ensuring the room for the spacing for preventing the short circuit. However, since the conventional semiconductor device having such constitution requires additionally forming the bit contact interlayer film 13 and the bit contact 14, the number of the processing steps may be considerably increased.

Further, the contact resistance thereof may be increased due to the existence of the bit contact 14 therebetween, as compared with the case where the bit line 6 is formed directly on the cell contact interlayer film 8.

A typical conventional method for manufacturing a semiconductor device having a constitution of preventing the short circuit of the bit line and the cell contact may be a method disclosed in, for example, JP-A-2001-257,325. In such conventional method for manufacturing the semiconductor device, where the bit contact interlayer film is not used, polycrystalline silicon is deposited in the interior of the contact hole to a level lower than the upper surface of the interlayer insulating film, and thereafter a silicide film is formed on the upper part of the polycrystalline silicon, in order to prevent a short circuit between the contact for the capacitive coupling and the bit line. Then, the side wall is formed after the formation of the bit line, and thereafter, the silicide film formed within the contact hole interior that is not covered with bit line is removed, thereby broadening the distance between the contact and the bit line.

Although the room for the spacing for preventing the short circuit between the bit line and the contact can be maintained without providing the bit contact interlayer film according to such conventional method for manufacturing the semiconductor device, the method requires additional processes such as a process for forming a side wall after the bit line formation, a process for forming a silicide film on the upper part of polycrystalline silicon in the contact hole, a process for removing the silicide film after bit line formation or the like, and thus the number of the processing steps is considerably increased.

The conventional method for manufacturing the semiconductor device stated above has a configuration, in which a room for the spacing for preventing the short circuit between the bit line and the cell contact is ensured by comprising the bit contact interlayer film, and therefore it is difficult to stably provide semiconductor devices having higher reliability.

SUMMARY OF THE INVENTION

According to one aspect of the present invention, there is provided a method for manufacturing a semiconductor device having a capacitive element on an upper portion of a transistor formed on a semiconductor substrate for coupling to the transistor, comprising: forming a transistor on a semiconductor substrate; forming a first interlayer insulating film covering the transistor; forming in the first interlayer insulating film a first electroconducting plug and a second electroconducting plug that couple to the transistor; forming on the first interlayer insulating film an interconnect being coupled to the first electroconducting plug; etching the second electroconducting plug to create an upper surface of the second electroconducting plug that is disposed lower than an upper surface of the first electroconducting plug; forming a second interlayer insulating film on the first interlayer insulating film to cover the interconnect; forming in the second interlayer insulating film a third electroconducting plug being coupled to the second electroconducting plug; and forming on the second interlayer insulating film a capacitive element being coupled to the second electroconducting plug. According to another aspect of the present invention, there is provided a semiconductor device, comprising: a semiconductor substrate; a transistor provided on the semiconductor substrate; a first interlayer insulating film provided on the semiconductor substrate to cover the transistor; a first electroconducting plug and a second electroconducting plug provided within the first interlayer insulating films to couple thereof to the transistor; an interconnect provided on the first interlayer insulating film to couple thereof to the first electroconducting plug; a second interlayer insulating film provided on the first interlayer insulating film to cover the interconnect; a third electroconducting plug provided within the second interlayer insulating films to couple thereof to the second electroconducting plug; and a capacitive element provided on the second interlayer insulating film to couple thereof to the third electroconducting plug, wherein an upper surface of the second electroconducting plug is lower than an upper surface of the first electroconducting plug.

According to the present invention, since an upper surface of the second electroconducting plug that is not coupled to interconnect can be created so that the uncoupled surface is lower than an upper surface of the first electroconducting plug that is coupled to the interconnect in one process that also provides the interconnect, larger room for the spacing for preventing the short circuit between the interconnect and the second electroconducting plug can be obtainable without increasing the number of the process steps. Further, since the need for having larger room for the spacing for preventing the short circuit between the interconnect and the second electroconducting plug by providing another interlayer insulating film is diminished, the contact resistance thereof can be reduced, in comparison with a case where another interlayer insulating film is provided to prevent the short circuit between the interconnect and the second electroconducting plug.

As described above, the present invention stably provides semiconductor devices having higher reliability.

DETAILED DESCRIPTION OF THE PREFERRED EMBODIMENTS

Embodiments of the present invention will be described in detail in reference to annexed figures.

Figure 1:
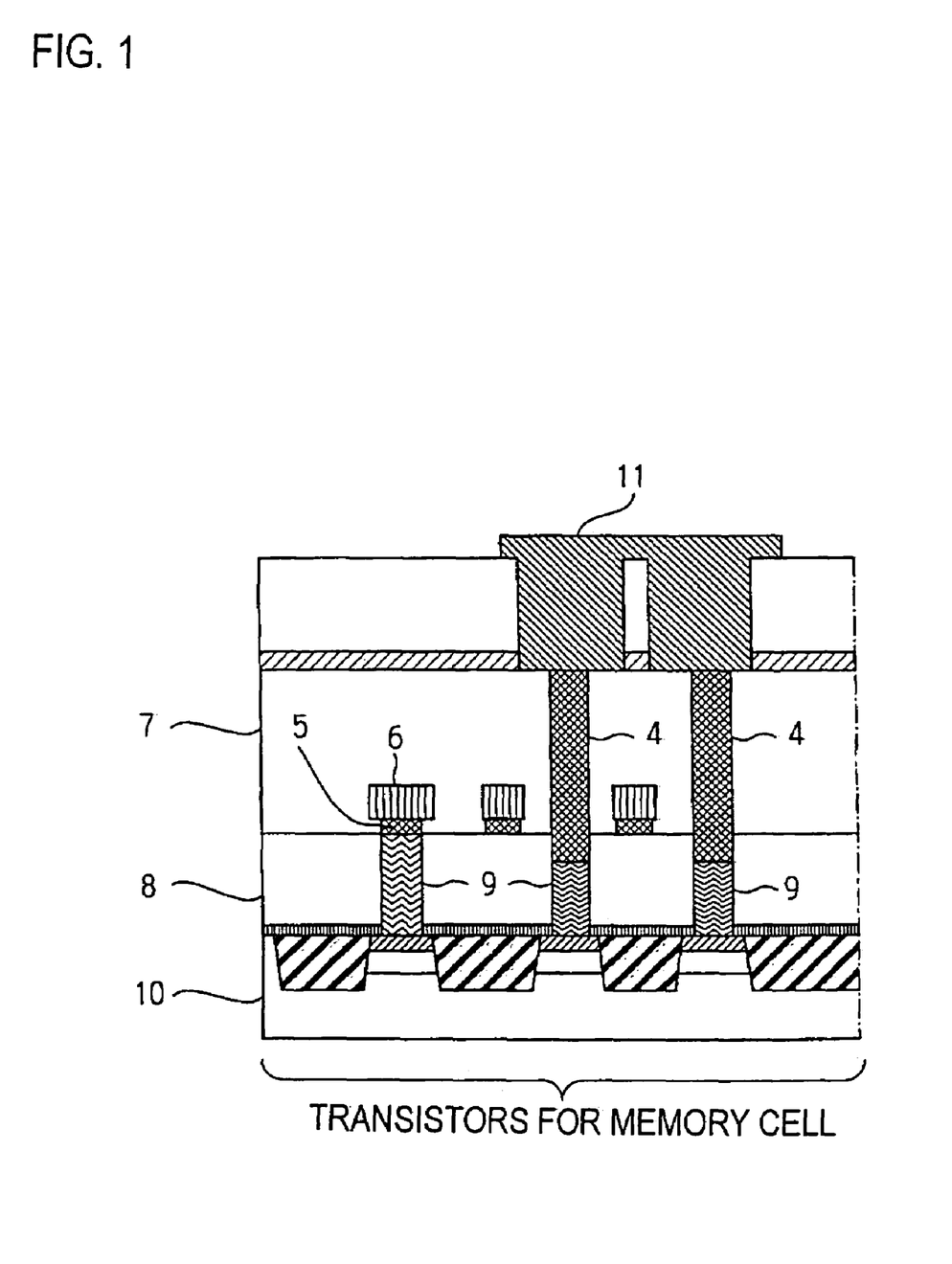
FIG. 1 is a cross sectional view of a semiconductor device manufactured by a method for manufacturing the semiconductor device of the first embodiment according to the present invention.

FIG. 1 is a cross sectional view of a semiconductor device manufactured by a method for manufacturing the semiconductor device of one embodiment according to the present invention. In FIG. 1, the identical numeral is employed to designate the identical component that is also appeared in FIG. 13, and related descriptions thereof are omitted.

A semiconductor device according to the present embodiment is, as shown in FIG. 1, a semiconductor device manufactured by the process, in which an upper surface of a cell contact 9 that is not coupled to a bit line 6 in the conventional semiconductor device having no bit contact interlayer film formed therein is created so that the created surface is lower than an upper surface of the cell contact 9 that is coupled to the bit line 6, in order to ensure having a room for the spacing for preventing the short circuit between the bit line 6 and the cell contact 9, and this provides that a capacitive contact 4 is embedded to a lower position than an upper surface of the cell contact 9 that is coupled to the bit line 6. Further, a barrier metal layer 5 formed on the lower surface of the bit line 6 is selectively etched, so that the barrier metal layer 5 is formed to have the width that is narrower than the width of the bit line 6 that is the upper-disposed layer thereof.

Having such a constitution, the bit line 6 and the cell contact 9 can be kept apart from each other, and thus the room for the spacing for preventing the short circuit between the bit line 6 and the cell contact 9 can be increased without forming a bit contact interlayer film, thereby eliminating the process steps such as a process for forming a bit contact interlayer film, a process for forming a bit contact or the like, and thereby also reducing the bit contact resistance.

Next, the method for manufacturing the semiconductor device of the present embodiment will be described in reference to FIG. 2 to FIG. 12.

Figure 2:
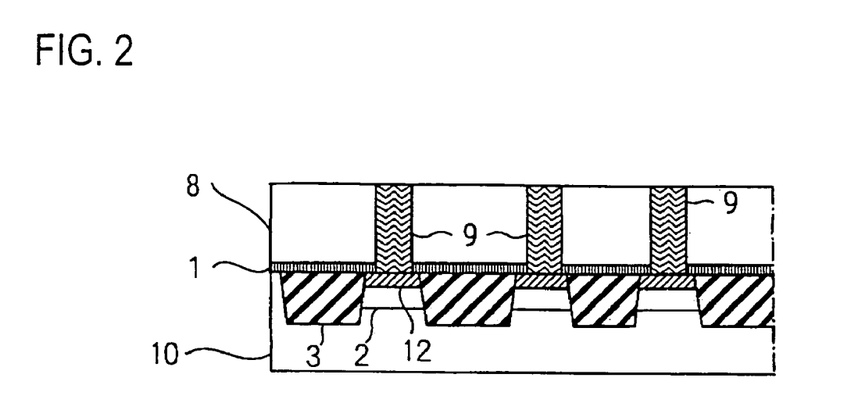
FIG. 2 is a cross sectional view of the semiconductor device illustrating the method for manufacturing the semiconductor device of the first embodiment according to the present invention.

First of all, as shown in FIG. 2, grooves having shallow groove patterns are formed in a silicon substrate 10, similarly as in the typical manufacturing process for DRAM, and element isolation insulating films 3, which are formed by filling these grooves with an insulating material are formed to section thereof into individual cells in a memory cell area. Then, an impurity is implanted into the silicon substrate 10 to form source drain regions 2, thereby forming MOS transistors that will be transistors for memory cell.

Then, silicidation of the entire surface of the diffusion layer and the gate of each transistor with cobalt is carried out to form cobalt silicide layers 12. Thereafter, silicon nitride films 1, which coat each transistor, are formed on the surface of the silicon substrate 10 including the surface of the element isolation insulating film 3.

Next, cell contact interlayer films 8 are formed by utilizing a material of silicon oxide or the like to cover the transistors for each memory cell in the memory cell area. Then, selective etching is conducted to form contact holes for coupling the transistors for memory cells of the cell contact interlayer films 8 to the bit line and the capacitive element. Then, barrier metal layers of titanium nitride (TiN) are deposited in the contact holes, and thereafter tungsten (W) is deposited on the entire surface thereof via chemical vapor deposition (CVD) until the contact holes are filled therewith. Thereafter, the surfaces of the cell contact interlayer films 8 are planarized via chemical mechanical polishing (CMP) to leave W only in each contact hole, thereby forming cell contacts 9. A cross sectional view of the semiconductor device after the steps so far are finished is shown in FIG. 2.

Figure 3:
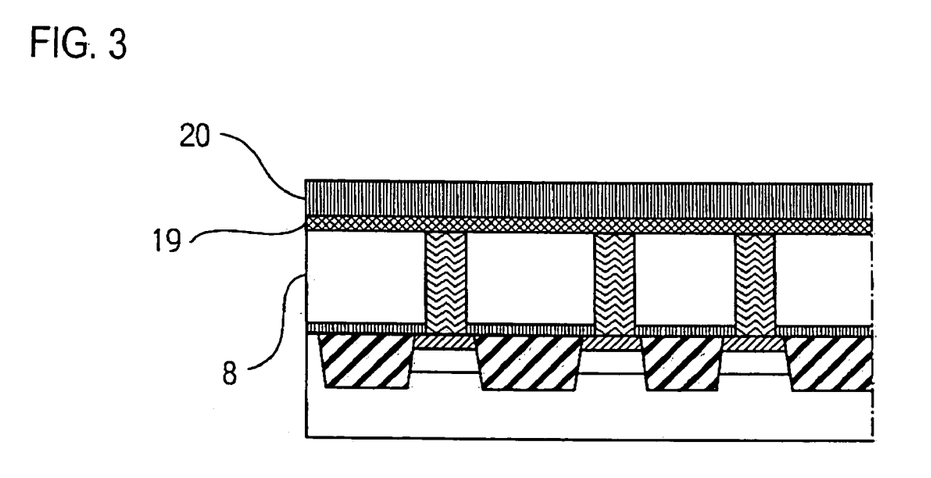
FIG. 3 is a cross sectional view of the semiconductor device illustrating the method for manufacturing the semiconductor device of the first embodiment according to the present invention.

Next, as shown in FIG. 3, a titanium nitride (TiN) film 19, which will be barrier metal layers 5, and tungsten (W) film 20, which will be bit lines 6, are deposited on the surfaces of the cell contact interlayer films 8 via the similar method as the conventional method.

Figure 4:
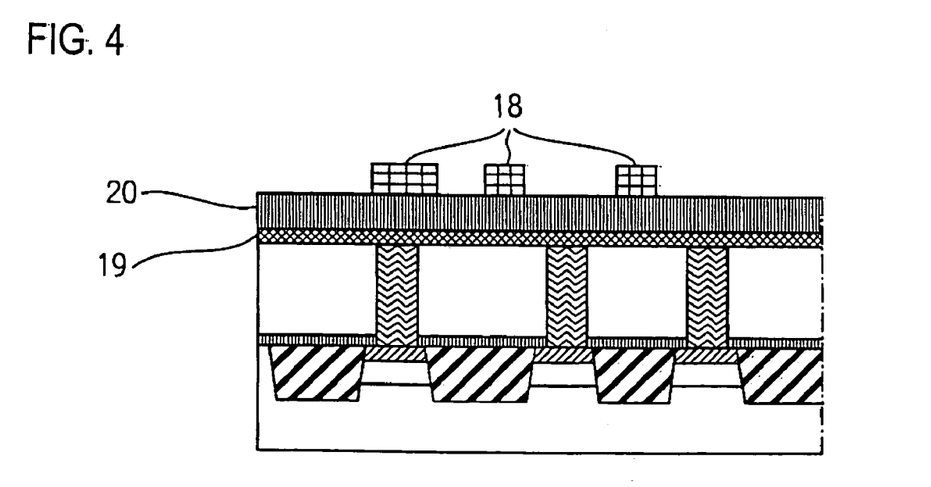
FIG. 4 is a cross sectional view of a semiconductor device illustrating a method for manufacturing the semiconductor device of the first embodiment according to the present invention.
Figure 5:
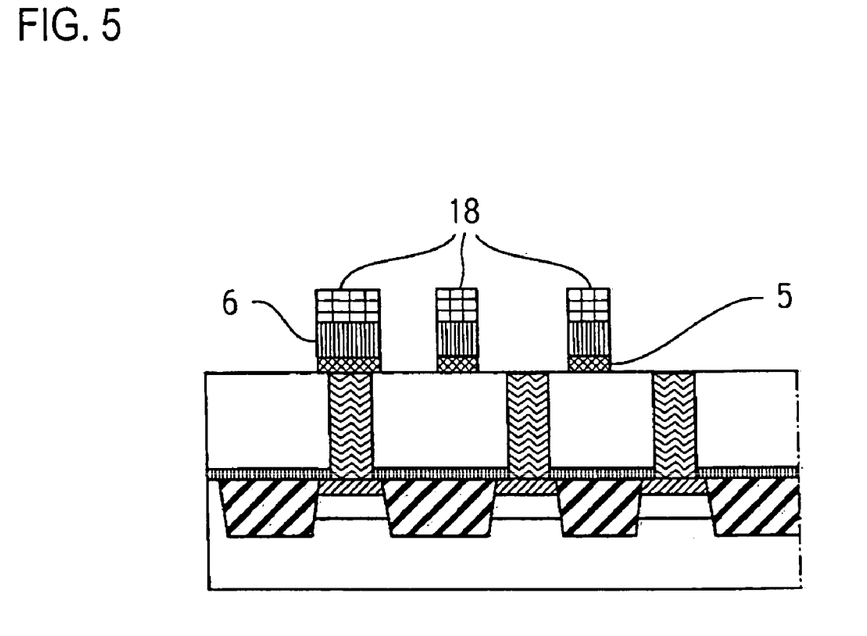
FIG. 5 is a cross sectional view of a semiconductor device illustrating a method for manufacturing the semiconductor device of the first embodiment according to the present invention.

Then, as shown in FIG. 4, photo resists 18 are formed on locations on the tungsten film 20 where bit lines will be formed. Then, as shown in FIG. 5, bit lines 6 and barrier metal layers 5 are patterned into the predetermined shapes through masks of the photo resists 18.

Here, when the tungsten film 20 is etched to form the bit lines 6, an etch gas that is capable of providing higher etch selection ratio with titanium nitride may be employed as a first etch gas, and when titanium nitride film 19 is etched to form the barrier metal layers 5, a $Cl_2$-containing gas is employed as a second etch gas. The etch selection ratio for tungsten to titanium nitride can be changed by changing the mixing ratio of $SF_6$-containing gas with other type of gas. Therefore, $SF_6$-containing etch gas, which is designed to provide higher etch selection ratio with titanium nitride by selecting an appropriate mixing ratio, is employed as a first etch gas in the present embodiment.

In the conventional method for manufacturing the semiconductor device, photo resist 18 is removed after the patterning of the bit lines 6 and the barrier metal layers 5 is finished. In the conventional method for manufacturing the semiconductor device stated above, since the bit contact interlayer films are provided to ensure a room for the spacing for preventing the short circuit between the bit lines and the cell contacts, following points are left to be improved.

(1) Additional process steps such as a process for forming bit contact interlayer films, a process for forming a bit contact or the like are required, thereby considerably increasing the required number of the manufacturing process steps.

(2) The contact resistance of the bit line increases, due to the existence of the bit contact between the cell contact and the bit line.

On the contrary, the present embodiment can provide the semiconductor device and the manufacturing method thereof, which can prevent the short circuit between the bit line and the cell contact and also reduce the contact resistance of the bit line, without considerably increasing the number of the manufacturing process steps.

In other words, according to the present embodiment, the following advantageous effects can be obtained.

(1) Since both of the formation process for forming the bit line and the treatment process, in which an upper surface of the cell contact that is not coupled to the bit line is formed to be lower than an upper surface of cell contact that is coupled to the bit line, can be simultaneously carried out in one process, larger room for the spacing for preventing the short circuit between the bit line and the cell contact can be obtained without increasing the number of the processing steps.

(2) Since it is not necessary to form a bit contact interlayer film for preventing the short circuit between the bit line and the cell contact, the contact resistance of the bit line can be reduced.

Figure 6:
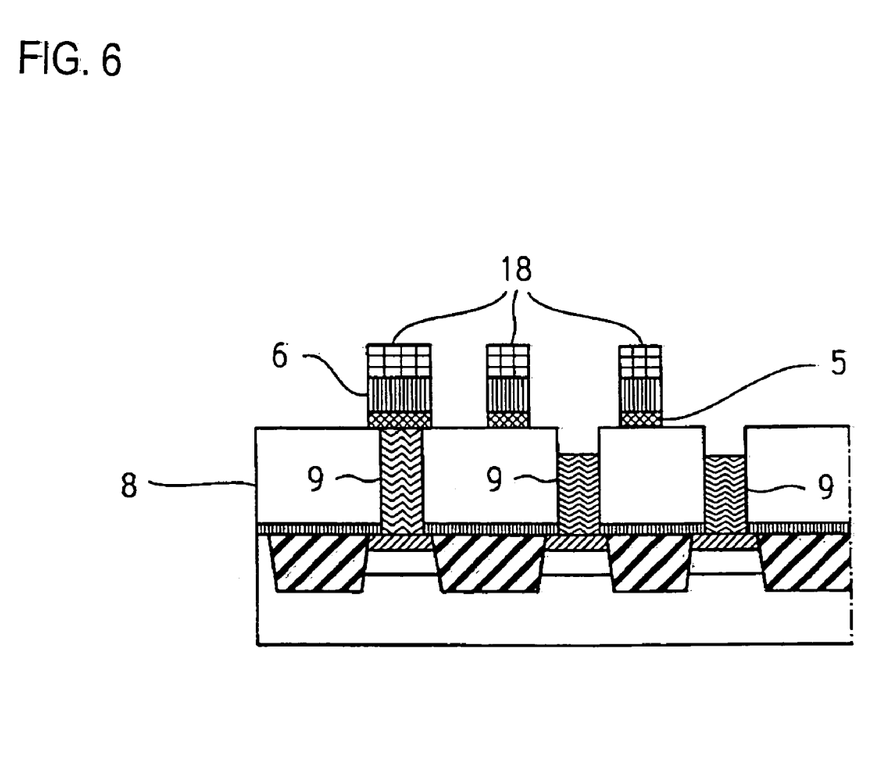
FIG. 6 is a cross sectional view of a semiconductor device illustrating a method for manufacturing the semiconductor device of the first embodiment according to the present invention.

More specifically, as shown in FIG. 6, the etch process using the first etch gas of the SF6-containing gas, which is designed to provide higher etch selection ratio with titanium nitride is conducted again in the present embodiment to etch back the cell contact 9 so that the upper surfaces of the cell contacts 9, which are not coupled to the bit lines 6, are lower than the portions of the upper surfaces of the cell contacts 9, which are coupled to the bit lines 6. Although the upper surfaces of the cell contacts 9, which are not coupled to the bit lines 6, are etched back by using the first etch gas, it is not necessary to conduct the etch process using the gas identical to the first etch gas, and the upper surfaces of the cell contacts 9, which are not coupled to the bit lines 6, may be etched back by using a third etch gas that is capable of providing higher selection ratio of tungsten and titanium nitride.

Since the bit line 6 is formed of the material, which is same as the material for forming the cell contact 9 in the present embodiment, the upper surface of cell contact 9 can be etched by using the first etch gas, which is also used for etching the bit line 6. However, even if the bit line 6 and the cell contact 9 are not formed of the same material, the etch process can be conducted by using the same etch gas if the bit line 6 and the cell contact 9 are formed of a material of similar characteristics. Here, the material of a similar characteristics means that a material, which is capable of providing smaller etch selection ratio, and also capable of being etched with an etch gas utilizing the same chemistry. Further, even if though bit line 6 and the cell contact 9 are not formed of the same material or the material of similar characteristics, or in other words, even though the bit line 6 and the cell contact 9 are respectively formed of a combination of materials capable of providing higher etch selection ratio, the etch process can be carried out by simply changing the etch gas, and thus it remains unchanged that the etch process for the upper surface of the cell contact 9 can be carried out in one process with the process for forming the bit line 6. However, if bit line 6 and cell contact 9 are designed to be formed of same material or a material of similar characteristics, the number of times of changing the etch gases required in one process can be reduced, or the necessity for using a plurality of the etching apparatus can be diminished.

In this etch process, since the cell contacts 9 coupled to the bit lines 6, which are covered by the bit lines 6, are not etched, the upper surfaces thereof are not hardly lower than that before the etch.

Here, specific examples of the etched-back quantities of the upper surface of the cell contact 9 may be the following values, for example.

Film thickness of the bit line 6 (W): 10 to 100 nm (50 nm, for example);

Film thickness of the barrier metal layer 5: 5 to 40 nm (20 nm, for example);

Size of the contact hole of the cell contact 9: 80 to 140 nm in diameter; and etch-back quantity of the cell contact 9: 10 to 100 nm (50 nm, for example).

Although the above illustration describes that the individual processes shown in FIG. 4 to FIG. 6 are carried out by separate processes, these processes of forming the bit line 6 and etching back the upper surface of the cell contact 9 can be continuously carried out in one etch process by simply selecting different components and concentrations of the etch gases, since these processes are the etching processes.

The method for conducting the etch of the bit line 6 and the etch back of the cell contact 9 in one process has been described above by illustrating the method of reducing the height of the cell contact 9 by etching the tungsten film 20 that will be the bit lines 6 and the titanium nitride film 19 that will be the barrier metal layer 5 and subsequently slightly etching the part of the cell contact 9 formed of tungsten again. However, the method for etching the bit line 6 and etching back the cell contact 9 in one process can also be achieved by the other two manners described below, in addition to the method described above.

(1) When tungsten film 20 is etched, $SF_6$-containing etch gas, which is designed to provide lower etch selection ratio with titanium nitride may be employed as the first etch gas. Having such configuration, the titanium nitride film 19 is also etched when the tungsten film 20 is etched, thereby exposing the cell contact 9. Then, after the cell contacts 9 are exposed, the tungsten film and the titanium nitride film composing the cell contact 9 are also etched. Thereafter, the titanium nitride film 19 is etched by employing a $Cl_2$-containing etch gas as the second etch gas.

(2) Alternatively, first of all, a thin barrier metal layer 5 is formed to have a film thickness of about 5 nm, for example. Then, similarly as in the above described (1), tungsten film 20 is etched by employing $SF_6$-containing etch gas, which is designed to provide lower etch selection ratio with titanium nitride. Having such configuration, the titanium nitride film 19 is also etched when the tungsten film 20 is etched, and the tungsten film and the titanium nitride film composing the exposed cell contact 9 are also etched. Therefore, only one etch condition may be employed for etching the tungsten film 20, titanium nitride film 19 and the cell contact 9.

In either of the above-described methods, the upper surfaces of the cell contacts 9 that are not coupled to the bit lines 6 can be formed to be lower than the upper surfaces of the cell contacts 9 that are coupled to the bit lines 6 in one process step in the manufacturing process for forming the bit lines 6, and thus larger room for the spacing for preventing the short circuit between the bit line 6 and the cell contact 9 can be obtained.

Figure 7:
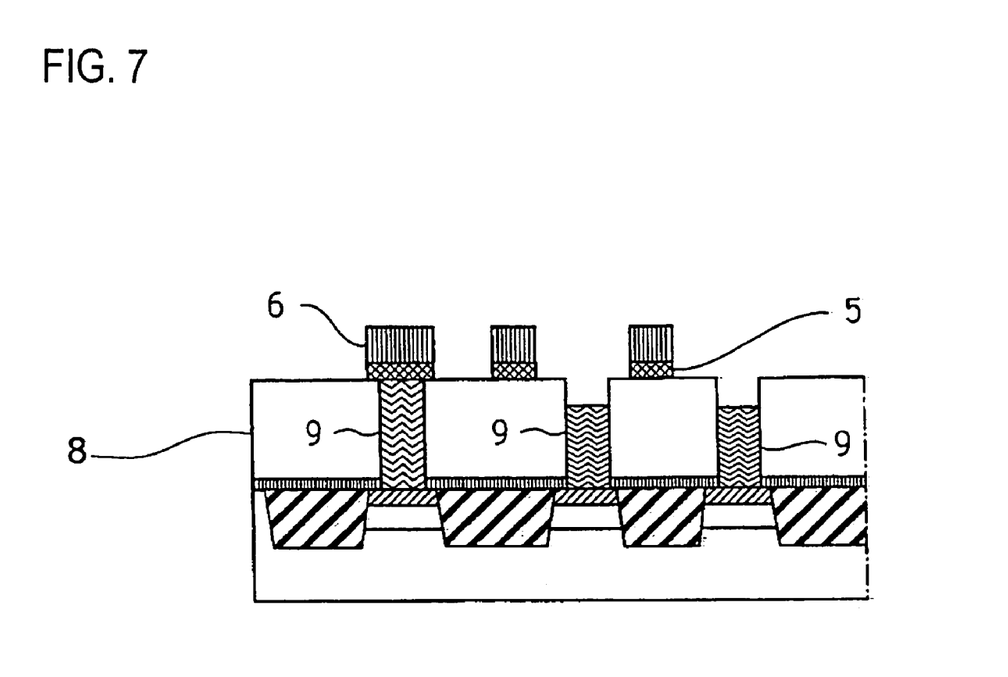
FIG. 7 is a cross sectional view of a semiconductor device illustrating a method for manufacturing the semiconductor device of the first embodiment according to the present invention.
Figure 8:
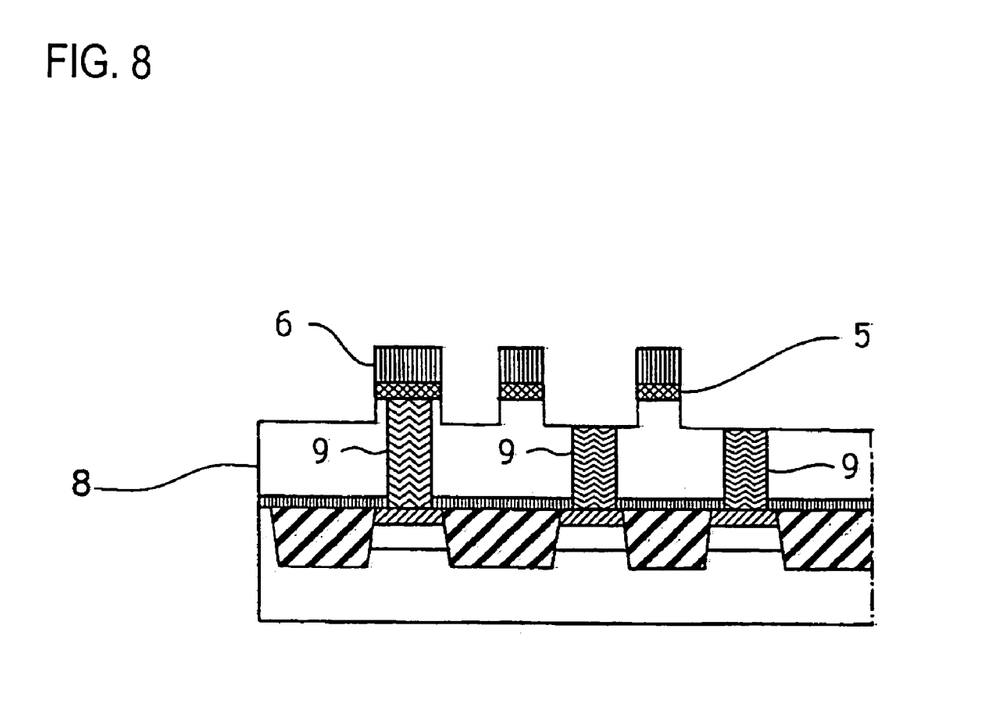
FIG. 8 is a cross sectional view of a semiconductor device corresponding to the cross sectional view of FIG. 7, illustrating the case when cell contact interlayer film 8 is etched.

Then, after the etch back of the cell contacts 9 is completed, the process for stripping the photo resists 18 is carried out as shown in FIG. 7.

Figure 9:
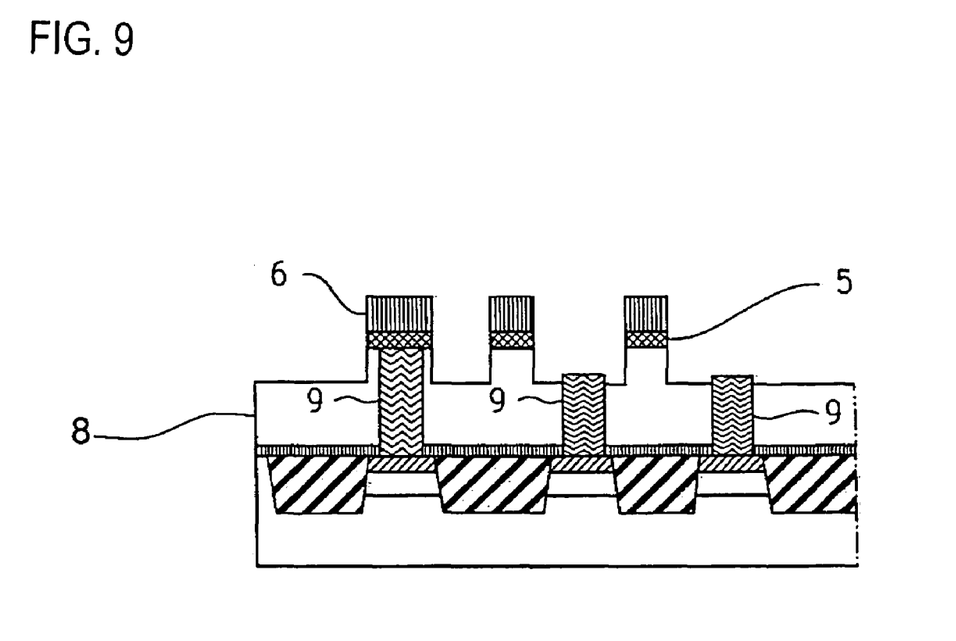
FIG. 9 is a cross sectional view of a semiconductor device corresponding to the cross sectional view of FIG. 7, illustrating the case when cell contact interlayer film 8 is etched.

Although the above illustration is described that the cell contact interlayer film 8 is not etched when the barrier metal layer 5 of the bit line 6 is etched, the cell contact interlayer film 8, which is an oxide film, may occasionally be etched depending upon the etch conditions. Therefore, the cross sectional view after the stripping of the photo resists 18 may be the cross sectional view shown in FIG. 8, and the upper surface of the cell contact interlayer films 8 may be coplanar to the upper surfaces of cell contacts 9 that are not coupled to the bit lines 6. Alternatively, the upper surface of the cell contact interlayer films 8 may be lower than the upper surfaces of the cell contacts 9 that are not coupled to the bit lines 6 as shown in FIG. 9, depending upon the etch conditions, and even in such case, enough distance between the lower surface of the bit lines 6 and the upper surface of the cell contacts 9 can be maintained, and thus no serious problem will be occurred.

However, in order to simplify the description in the following illustration, the descriptions in following illustration will be made by assuming that the cell contact interlayer film 8 is not etched when the barrier metal layer 5 of the bit line 6 is to be etched.

Figure 10:
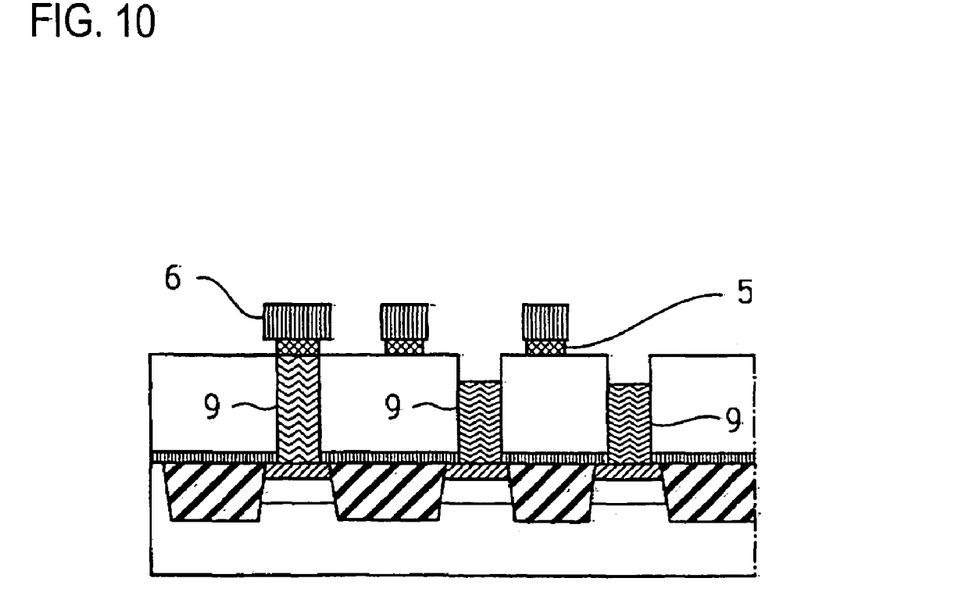
FIG. 10 is a cross sectional view of a semiconductor device illustrating a method for manufacturing the semiconductor device of the first embodiment according to the present invention.

Next to the process shown in FIG. 7, the barrier metal layer 5 formed of titanium nitride is etched by using a gas of $CF_4$ or the like that is capable of providing selectively etching only titanium nitride (TiN) so that the width of the barrier metal layer 5 is narrower than the width of the bit line 6 that is the upper layer thereof, as shown in FIG. 10.

Figure 11:
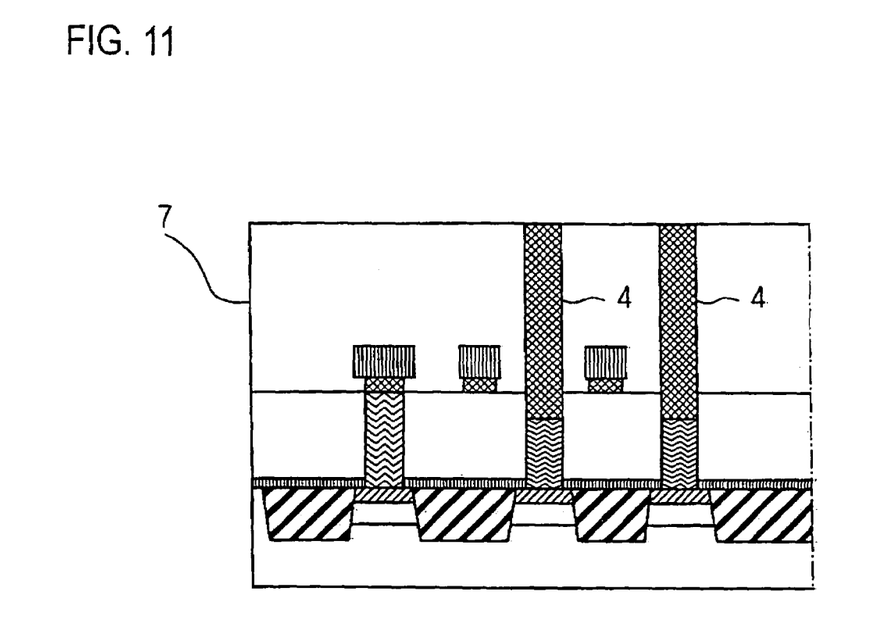
FIG. 11 is a cross sectional view of a semiconductor device illustrating a method for manufacturing the semiconductor device of the first embodiment according to the present invention.

After the barrier metal layer 5 is selectively etched, capacitive contact interlayer films 7 and capacitive contacts 4 are formed by the method similar to the conventional method, as shown in FIG. 11. Here, since the upper surfaces of the cell contacts 9, which are not coupled to the bit line 6, are etched back to become lower than the upper surface of the cell contact 9 that are coupled to the bit line 6, the capacitive contacts 4 are embedded to positions that are lower than the upper surfaces of the contact hole apertures of the cell contact interlayer films 8.

Figure 12:
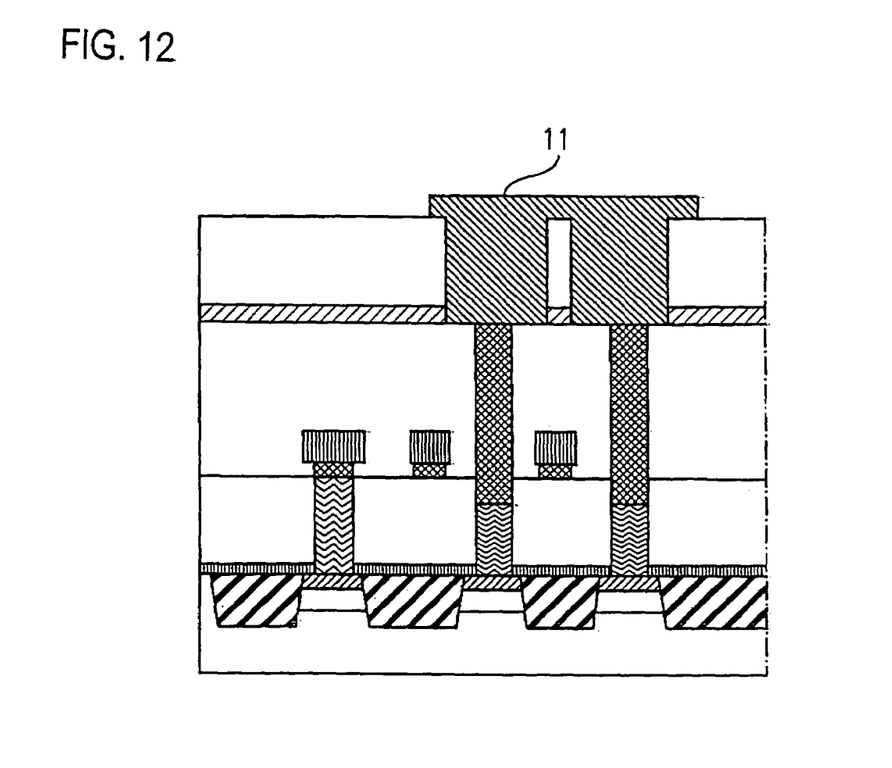
FIG. 12 is a cross sectional view of a semiconductor device illustrating a method for manufacturing the semiconductor device of the first embodiment according to the present invention.

Eventually, a capacitive element 11 is formed by a method similar to the conventional method as shown in FIG. 12, thereby completing the semiconductor device in the present embodiment.

In the method for manufacturing the semiconductor device of the present embodiment, since the upper surfaces of the cell contacts 9 that are not coupled to the bit lines 6 are formed to be lower the upper surfaces of cell contacts 9 that are coupled to the bit lines 6 in one process with the formation process for forming the bit lines 6, larger room for the spacing for preventing the short circuit between the bit line and the cell contact can be obtained without increasing the number of the processing steps.

In the conventional method for manufacturing the semiconductor device disclosed in the above-mentioned JP-A-2001-257,325, additional process steps other than dry etch process such as deposition process, wet etch process or the like are required between the process steps of forming the bit line by etching and removing the silicide film to further separate the cell contact and the bit line. Thus, it is difficult to sequentially conduct the formation process for forming the bit line and the treatment process, in which upper surfaces of the cell contacts that are not coupled to the bit line are formed to be lower than the upper surfaces of cell contacts that are coupled to the bit line. On the contrary, in the present embodiment, it is possible to sequentially conduct the formation process for forming the bit line and the treatment process, in which upper surfaces of the cell contacts that are not coupled to the bit lines are formed to be lower than the upper surfaces of the cell contacts that are coupled to the bit lines by conducting only one process of the dry etching process, and thus it is not necessary to increase the number of the process steps.

Further, the barrier metal layer 5 formed of titanium nitride is etched by using a gas of $CF_4$ or the like that is capable of providing selectively etching only titanium nitride (TiN) so that the width of the barrier metal layer 5 is narrower than the width of the bit line 6 that is the upper layer thereof, and thus the room for the spacing for preventing the short circuit between the bit line 6 and the cell contact 9 can be further extended. Since the distance between the bit line 6 and the cell contact 9 can be extended by selectively etching the barrier metal layer 5 of the bit line 6, the short circuit between the bit line 6 and the cell contact 9 or the short circuit between the of bit line 6 and the capacitive contact 4 can be inhibited. Further, when the barrier metal layer 5 of the bit line 6 is selectively etched, the barrier metal layer of cell contact 9 is also etched, and thus the space between the cell contact 9 and the bit line 6 is extended, thereby inhibiting the short circuit between the cell contact 9 and the bit line 6.

Although one process step should be added for selectively etching the barrier metal layer 5 after the formation of the bit line 6, the number of the additional process steps is minimum in comparison with the case where several additional process steps such as forming the bit contact interlayer film or forming the bit contact should be added, and thus this configuration does not considerably increase the number of the process steps.

Further, as in the present embodiment, the upper surfaces of the cell contacts 9 that are not coupled to the bit lines 6 may be formed to be lower than the upper surfaces of the cell contacts 9 that are coupled to the bit line 6, and the barrier metal layers 5 may be formed to have the width that is narrower than the width of the bit line 6, so that the distance between the bit line 6 and the cell contact 9 can be extended, and thus it is not necessary to provide the bit contact interlayer film for the purpose of having larger room for the spacing for preventing the short circuit between the bit line 6 and the cell contact 9. Consequently, the bit contact resistance can be reduced in comparison with the conventional semiconductor device, which is provided with the bit contact interlayer film for preventing the short circuit between the bit line 6 and the cell contact 9.

Although the present embodiment is intended to inhibit the short circuit between the bit line 6 and the cell contact 9 by conducting both of the treatment process where the upper surfaces of the cell contacts 9 that are not coupled to the bit lines 6 may be formed to be lower than the upper surfaces of the cell contacts 9 that are coupled to the bit lines 6, and the etching process for selectively etching the barrier metal layers 5, it is still possible to inhibit the short circuit between the bit line 6 and the cell contact 9 by conducting the each of the processes.

In addition, although it is described in the present embodiment that the barrier metal layers 5 are selectively etched after the photo resists 18 utilized for forming the bit lines 6 are stripped, the barrier metal layers 5 may selectively be etched before photo resists 18 are stripped.

In addition, although the present embodiment is described by illustrating the case where the short circuit between the bit line and the cell contact are intended to be prevented in the structure of DRAM comprising the transistors for the memory cell and the capacitive elements, the present invention is not particularly limited thereto. The present invention can be equally applied to the semiconductor device provided that the semiconductor device comprises an interconnect formed on the upper layer of the transistor formed on the semiconductor substrate through the first contact interlayer film, and other element formed on the upper layer of the interconnect through the second contact interlayer film.

In other words, again, a method for manufacturing a semiconductor device having an element on an upper layer of a transistor formed on a semiconductor substrate for electrically coupling to the transistor, comprising:

forming a transistor on a semiconductor substrate;

forming a first contact interlayer film covering the transistor;

forming a plurality of first contacts in the first contact interlayer film for electrically coupling to the transistor;

forming on the first contact interlayer film an interconnect electrically coupled to the first contact and etching thereof so that an upper surface of a plurality of first contact, which is not coupled to the interconnect, is lower than an upper surface of a plurality of first contact, which is coupled to the interconnect;

forming a second contact interlayer film on the first contact interlayer film to cover the interconnect;

forming a second contact on the second contact interlayer film for electrically coupling thereof to the first contact; and forming an element on the second contact interlayer film for electrically coupling to the second contact.

According to the present invention, since the upper surface of the first cell contact that is not coupled to interconnect can be created so that the uncoupled surface is lower than an upper surface of the first contact that is coupled to the interconnect in one process that also creates the interconnect, larger room for the spacing for preventing the short circuit between the interconnect and the first cell contact can be obtainable without increasing the number of the process steps. Further, since the need for having larger room for the spacing for preventing the short circuit between the interconnect and the first contact by providing another contact interlayer film is diminished, the contact resistance thereof can be reduced, in comparison with a case where another contact interlayer insulating film is provided to prevent the short circuit between the interconnect and the first contact.

Further, according to another method of the present invention, the interconnect is formed, and the method additionally includes the process of selectively etching the barrier metal layer formed on the lower surface of the aforementioned interconnect, after the process for conducting the etching, so that an upper surface of the plurality of first contact, which is not coupled to the interconnect, becomes lower than the upper surface of the plurality of first contact, which is coupled to the interconnect.

According to the present invention, since the distance between the interconnect and the first contact and/or the distance between the interconnect and the second contact can be extended by selectively etching the barrier metal layer 5 to form the width of the barrier metal layer being narrower than the width of the interconnect disposed above thereof, the short circuit between the interconnect and the first contact can further be prevented.

Further another method for manufacturing the semiconductor device of the present invention is a method for manufacturing a semiconductor device having a capacitive element on an upper layer of a transistor formed on a semiconductor substrate for electrically coupling to the transistor, comprising:

forming a transistor on a semiconductor substrate;

forming a cell contact interlayer film covering the transistor;

forming a plurality of cell contacts in the cell contact interlayer film for electrically coupling to the transistor;

forming on the cell contact interlayer film an interconnect electrically coupled to the cell contact and etching thereof so that an upper surface of a plurality of cell contact, which is not coupled to the interconnect, is lower than an upper surface of a plurality of cell contact, which is coupled to the interconnect;

forming a capacitive contact interlayer film on the cell contact interlayer film to cover the bit line;

forming a capacitive contact on the capacitive contact interlayer film for electrically coupling thereof to the cell contact; and forming an capacitive element on the capacitive contact interlayer film for electrically coupling to the capacitive contact.

According to the present invention, since the upper surface of the cell contact that is not coupled to the bit line can be created so that the uncoupled surface is lower than the upper surface of the cell contact that is coupled to the bit line in one process that also creates the bit line, larger room for the spacing for preventing the short circuit between the bit line and the cell contact can be obtainable without increasing the number of the process steps. Further, since the needs for having larger room for the spacing for preventing the short circuit between the bit line and the cell contact by providing the bit contact interlayer film are diminished, the bit contact resistance thereof can be reduced, in comparison with the conventional semiconductor device being provided with the bit contact interlayer film for preventing the short circuit between the bit line and the cell contact.

Further, in the other method for manufacturing the semiconductor device according to the present invention, the process for forming the bit line may include forming the bit line with the material, which is same as the material for forming the cell contact.

According to the present invention, since the cell contact and the bit line are formed of the same material, the upper surface of the cell contact can be etched by using an etch gas that is also used for creating the bit line.

Further, the same material may be a material consisting essentially of tungsten and titanium nitride.

Further, according to another method of the present invention, the bit line is formed, and the method additionally includes the process of selectively etching the barrier metal layer formed on the lower surface of the aforementioned bit line, after the process for conducting the etching, so that an upper surface of a plurality of the cell contacts, which is not coupled to the bit line, becomes lower than an upper surface of a plurality of the cell contacts, which is coupled to the bit line.

According to the present invention, since the distance between the bit line and the cell contact and/or the distance between the bit line and the capacitive contact can be extended by forming the width of the barrier metal layer being narrower than the width of the bit line disposed above thereof, the short circuit between the bit line and the cell contact can further be prevented.

Further, according to another method of the present invention, the bit line is formed, and the process for conducting an etching to create an upper surface of a plurality of cell contacts that is not coupled to the bit line, being lower than the upper surface of a plurality of cell contacts that is coupled to the bit line, comprises;

conducting the etching with a first etch gas to pattern the bit line;

conducting the etching with a second etch gas to pattern the barrier metal layer disposed on the lower surface of the bit line; and conducting the etching with a third etch gas to create an upper surface of the plurality of cell contacts that is not coupled to the bit line being lower than an upper surface of a plurality of cell contacts that is coupled to the bit line.

Further, according to further method of the present invention, the bit line is formed, and the process for conducting an etching to create an upper surface of a plurality of cell contacts that is not coupled to the bit line, being lower than the upper surface of a plurality of cell contacts that is coupled to the bit line, comprises;

conducting the etching with a first etch gas to pattern the bit line and the barrier metal layer which is formed on a lower surface of the bit line; and conducting the etching with a second etch gas to create an upper surface of the plurality of cell contacts that is not coupled to the bit line being lower than an upper surface of a plurality of cell contacts that is coupled to the bit line.

Further, according to yet other method of the present invention, the bit line is formed, and the process for conducting an etching to create an upper surface of a plurality of cell contacts that is not coupled to the bit line, being lower than the upper surface of a plurality of cell contacts that is coupled to the bit line, comprises;

conducting the etching under an etch condition to pattern the bit line and the barrier metal layer which is formed on a lower surface of the bit line, and to create an upper surface of a plurality of cell contacts, which is not coupled to the bit line, becomes lower than an upper surface of a plurality of cell contacts, which is coupled to the bit line.

What is claimed is:

1. A semiconductor device, comprising:
   a semiconductor substrate;
   a transistor provided on said semiconductor substrate;
   a first interlayer insulating film provided on said semiconductor substrate to cover said transistor;
   a first electroconducting plug and a second electroconducting plug provided within said first interlayer insulating film to couple thereof to said transistor;
   an interconnect provided on said first interlayer insulating film to couple thereof to said first electroconducting plug;
   a second interlayer insulating film provided on said first interlayer insulating film to cover said interconnect;
   a third electroconducting plug provided within said second interlayer insulating film to couple thereof to said second electroconducting plug wherein a portion of said third electroconducting plug is disposed within said first interlayer insulting film; and
   a capacitive element provided on said second interlayer insulating film to couple thereof to said third electroconducting plug,
   wherein an upper surface of said second electroconducting plug is lower than an upper surface of said first electroconducting plug, and
   wherein a cross-sectional shape of said first electroconducting plug is rectangular or trapezoidal.

2. The semiconductor device according to claim 1, wherein: said first interlayer insulating film is a cell contact interlayer film; said first electroconducting plug and said second electroconducting plug are cell contacts; said interconnect is a bit line; said second interlayer insulating film is a capacitive contact interlayer film; and said third electroconducting plug is a capacitive contact.

3. The semiconductor device according to claim 1, wherein said interconnect comprises a material which constitutes said second electroconducting plug.

4. The semiconductor device according to claim 3, wherein both of said second electroconducting plug and said interconnect comprise multilayered members, each comprising a layer containing tungsten and a layer containing titanium nitride.

5. The semiconductor device according to claim 1, wherein said interconnect comprises a multilayered film including a barrier metal layer provided on said first interlayer insulating film and an electrically conducting layer disposed on said barrier metal layer.

6. A semiconductor device, comprising:
a semiconductor substrate;
a transistor provided on said semiconductor substrate;
a first interlayer insulating film provided on said semiconductor substrate to cover said transistor;
a first electroconducting plug and a second electroconducting plug provided within said first interlayer insulating film to couple thereof to said transistor;
an interconnect provided on said first interlayer insulating film to couple thereof to said first electroconducting plug;
a second interlayer insulating film provided on said first interlayer insulating film to cover said interconnect;
a third electroconducting plug provided within said second interlayer insulating film to couple thereof to said second electroconducting plug; and
a capacitive element provided on said second interlayer insulating film to couple thereof to said third electroconducting plug,
wherein an upper surface of said second electroconducting plug is lower than an upper surface of said first electroconducting plug,
wherein said interconnect comprises a multilayered film including a barrier metal layer provided on said first interlayer insulating film and an electrically conducting layer disposed on said barrier metal layer, and
wherein said barrier metal layer has a width, which is narrower than the width of said electrically conducting layer.

7. The semiconductor device according to claim 6, wherein an upper surface of the second electroconducting plug is lower than an upper surface of the first interlayer insulating film.

8. The semiconductor device according to claim 6, wherein an upper surface of the second electroconducting plug is higher than an upper surface of the first interlayer insulating film that is surrounding said second electroconducting plug.

9. The semiconductor device according to claim 6, wherein an upper surface of the second electroconducting plug is formed to have the same height as an upper surface of the first interlayer insulating film that is surrounding said second electroconducting plug.

10. A semiconductor device, comprising:
a first contact interlayer film formed to cover a transistor disposed on a semiconductor substrate;
a plurality of first contacts formed in said first contact interlayer film for electrically coupling to said transistor;
an interconnect formed on said first contact interlayer film for electrically coupling thereof to one of said plurality of first contacts;
a barrier metal layer between said interconnect and said one of said plurality of first contacts;
a second contact interlayer film formed on said first contact interlayer film to cover said interconnect;
a second contact formed in said second contact interlayer film for electrically coupling thereof to said first contact; and
an element formed on said second contact interlayer film to electrically couple thereof to said second contact,
wherein said interconnect and said one of said first contacts are formed of the same material, and
wherein an upper surface of said plurality of first contacts, which is not coupled to said interconnect, is formed to be lower than a lower surface of said barrier metal layer.

11. The semiconductor device according to claim 10, wherein said interconnect comprises a material which constitutes said second contact.

12. The semiconductor device according to claim 11, wherein both of said second contact and said interconnect comprise multilayered members, each comprising a layer containing tungsten and a layer containing titanium nitride.

* * * * *